(12) United States Patent
Guenther (10) Patent No.: US 10,908,197 B2
(45) Date of Patent: Feb. 2, 2021

(54) MEASUREMENT DEVICE AND CONFIGURATION METHOD

(71) Applicant: Rohde & Schwarz GmbH & Co. KG, Munich (DE)

(72) Inventor: Mario Guenther, Glauchau (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 425 days.

(21) Appl. No.: 15/282,573

(22) Filed: Sep. 30, 2016

(65) Prior Publication Data

US 2018/0095116 A1 Apr. 5, 2018

(51) Int. Cl.
| | |
|---|---|
| *G01R 31/319* | (2006.01) |
| *G01R 19/25* | (2006.01) |
| *G01R 13/02* | (2006.01) |
| *G06F 11/32* | (2006.01) |
| *G01R 13/34* | (2006.01) |
| *G01R 31/28* | (2006.01) |

(Continued)

(52) U.S. Cl.
CPC ......... *G01R 19/2506* (2013.01); *G01R 13/02* (2013.01); *G01R 13/029* (2013.01); *G01R 13/34* (2013.01); *G01R 15/04* (2013.01); *G01R 19/10* (2013.01); *G01R 31/2834* (2013.01); *G01R 31/31912* (2013.01); *G06F 7/50* (2013.01); *G06F 7/52* (2013.01); *G06F 11/322* (2013.01)

(58) Field of Classification Search
CPC .. G01R 19/2506; G01R 13/029; G01R 19/10; G01R 15/04; G06F 7/50; G06F 7/52
See application file for complete search history.

(56) References Cited

U.S. PATENT DOCUMENTS

| | | | | |
|---|---|---|---|---|
| 2,244,369 A | * | 6/1941 | Martin | G01R 27/12 250/214 R |
| 3,582,955 A | * | 6/1971 | McMurray | G06K 15/22 346/17 |

(Continued)

FOREIGN PATENT DOCUMENTS

| | | |
|---|---|---|
| DE | 10139495 A1 | 11/2002 |
| EP | 2998692 A1 | 3/2016 |
| JP | 2017116286 A | 6/2017 |

OTHER PUBLICATIONS

"Scientific Calculator Operation Guide," Mar. 2005, Sharp Corporation, V/R Series, pp. 1-30. (Year: 2005).*

(Continued)

*Primary Examiner* — John E Breene
*Assistant Examiner* — Christine Y Liao
(74) *Attorney, Agent, or Firm* — Shumaker & Sieffert, P.A.

(57) ABSTRACT

The present invention provides a measurement device for measuring a number of physical variables, the measurement device comprising a number of parameter inputs, wherein the parameter inputs are configured to receive parameter values, which configure at least one function of the measurement device, a calculation unit, which controllably performs calculation functions with at least one parameter value provided in a respective parameter input and replaces the parameter value in the respective parameter input with the result of the calculation, and a number of function keys, wherein every function key controls the calculation unit to perform a predetermined one of the calculation functions.

20 Claims, 4 Drawing Sheets

(51) Int. Cl.
  *G01R 15/04* (2006.01)
  *G01R 19/10* (2006.01)
  *G06F 7/50* (2006.01)
  *G06F 7/52* (2006.01)

(56) References Cited

U.S. PATENT DOCUMENTS

| | | | |
|---|---|---|---|
| 4,072,851 A | 2/1978 | Rose | |
| 5,081,592 A * | 1/1992 | Jenq | G01R 13/34 345/440.1 |
| 5,148,411 A | 9/1992 | Shalvi | |
| 5,162,723 A | 11/1992 | Marzalek et al. | |
| 2002/0087279 A1 * | 7/2002 | Hall | G01R 13/02 702/68 |
| 2002/0154118 A1 * | 10/2002 | McCarthy | G06T 11/206 345/440 |
| 2011/0109320 A1 * | 5/2011 | Curt | H04B 3/546 324/543 |
| 2013/0211751 A1 * | 8/2013 | Park | G01R 21/06 702/61 |

OTHER PUBLICATIONS

"Voltage Divider," Feb. 21, 2014, Hyperphysics, http://hyperphysics.phy-astr.gsu.edu/hbase/electric/voldiv.html, Assessed on Feb. 21, 2014 by WaybackMachine.org. (Year: 2014).*
Communication of the extended European search report for European Patent Application No. 17152321.0 (dated Aug. 3, 2017).
Schmidt, "CBL™ Made Easy! 5 Steps to Getting Started with the CBL System, Vernier Sensors, and Texas Instruments Graphing Calculators," Vernier Software and Technology, pp. 1-18 (May 3, 2004).
Hinkelmann et al., "Introduction to the Practical Use of the CBL and CBR in Physics," Proc. of the Third International DERIVE/TI-92 Conference, pp. 1-17 (Jul. 14, 1998).
"3rd Generation Partnership Project; Technical Specification Group Radio Access Network; Evolved Universal Terrestrial Radion Access (E-UTRA) Medium Access Control (MAC) protocol specification (Release 8)," Technical Specification, 3GPP TS 36.32 V8.0.0, pp. 1-23 (Dec. 2007).
Office Action received in corresponding European Application No. 17152321.0, dated Feb. 27, 2020, 7 pp.

* cited by examiner

MEASUREMENT DEVICE AND CONFIGURATION METHOD

TECHNICAL FIELD

The present invention relates to a measurement device. The present invention further relates to a configuration method for such a measurement device.

BACKGROUND

Although applicable in principal to any electronic device with user input, the present invention and its underlying problem will be hereinafter described in combination with test and measurement devices, such as oscilloscopes and network analyzers.

In modern oscilloscopes a plurality of different parameters can be set by a user e.g. for recording and displaying measurement values. Usually, one parameter field is provided for each one of the single parameters, which can be set by the user. One single parameter value is provided by the user in the respective parameter field. This single value is used e.g. by a signal processing unit or control unit of the oscilloscope to configure e.g. the measurement process or the displaying of measured values.

SUMMARY

Against this background, the problem addressed by the present invention is a need for simplifying the parametrization of oscilloscopes.

Accordingly it is provided:

A measurement device for measuring a number, i.e. one or more, of physical, e.g. electrical, variables comprises a number, i.e. one or more, of parameter inputs, wherein the parameter inputs are configured to receive parameter values, which configure at least one function, e.g. a measurement function or results displaying function, of the measurement device, a calculation unit, e.g. a calculation processor, which controllably performs calculation functions with at least one parameter value provided in a respective parameter input and replaces the parameter value in the respective parameter input with the result of the calculation, and a number, i.e. one or more, of function keys, wherein every function key controls the calculation unit to perform a predetermined one of the calculation functions, e.g. when the respective function key is actuated by a user.

A configuration method for a measurement device for measuring a number of physical variables comprises receiving parameter values, which configure at least one function of the measurement device, via a number of parameter inputs, reading a number of function keys, wherein every function key refers to a predetermined calculation function, based on the readings of the function keys performing the respective calculation function of a plurality of calculation functions with at least one parameter value provided in a respective one of the parameter inputs, and replacing the parameter value in the respective parameter input with the result of the calculation.

Modern measurement devices can comprise a plurality of measurement inputs and perform a plurality of complex measurement tasks on a plurality of different physical variables at the same time. Such a measurement device can e.g. be an oscilloscope or a network tester, which measures a plurality of voltages or currents in a complex electrical circuit.

Usually, a user can configure certain parameters in the measurement device, like e.g. the voltage range of measured voltages or the voltage range of a diagram, which shows the measured values. The parameters, which are set by the user, are then used by the measurement device, e.g. by a controller in the measurement device, to configure the measuring hardware or the display. The controller can e.g. configure amplifiers, analog-to-digital converters, timers, display functions and the like.

In some measurement devices, such parameters can be set once for all measurement inputs. In other devices, such parameters can be set individually for every measurement input.

However, independently of the number of measurement inputs, the user must know the respective values he has to input into the parameter inputs. In case that e.g. just a single voltage, which ranges from 0 V to 5 V is measured, this parameter can easily be identified by the user.

In complex electrical circuits, electrical elements like e.g. amplifiers, multipliers, dividers and the like modify the voltages throughout the electrical circuit. This makes it difficult for the user to determine the correct values for the respective parameter inputs, which define or parameterize measurements at nodes of such complex electrical circuits.

The present invention therefore provides the user with a tool that allows him to derive functionally the correct values for the parameter inputs with the help of the calculation unit.

The calculation unit will e.g. take values, which are sequentially provided by the user to one parameter input. The user can select a respective calculation function by use of the function keys, which is then performed with the values by the calculation unit. In one operation mode, the calculation unit will receive a first value via the respective parameter input, then a selection of a calculation function, and then a second value. As an alternative, in a second operation mode, the user can input a plurality of values into a parameter input and then select via a function key a calculation function, which is to be performed on the received values.

The calculation unit then inputs the result of the calculation into the parameter input. This also implies that the result of the calculation is used as a parameter for configuring the measurement device.

The parameter inputs can either be separate physical inputs, which are physically selected or activated, e.g. by respective push buttons and comprise a single alphanumeric display. As an alternative, the physical inputs can e.g. be parameter inputs, which are displayed as input fields on a graphical display of the measurement device. The respective parameter inputs can still be activated by push buttons. However, activation via a touch sensitive display is also possible. Any other type of input is also possible. The single values for the parameter inputs can e.g. be provided via a keyboard, e.g. via a standard PC keyboard or via a specific keyboard, which comprises numbers, comma, dot, and function keys. The display of the respective keys on a touch screen is also possible.

Based on the finding of the present invention, the user can therefore mathematically model the functions in the electric circuit to be measured and automatically determine the correct parameter values. This greatly simplifies the identification of the correct parameter values for the user.

Further embodiments of the present invention are subject of the further subclaims and of the following description, referring to the drawings.

In one embodiment, one of the calculation functions can comprise adding or subtracting at least two parameter values. This e.g. allows automatically calculating value ranges for physical variables, which additively or subtractively overlay each other. If for example, the user wants to display voltages, which additively overlay each other, the user can simply input the maximum values of the voltages and select the sum function. While this may be a simple calculation if only two integer values or whole-number values have to be added, this calculation becomes more complex with the number of voltages and if e.g. decimal numbers are present. The present invention therefore takes the burden of the user to pre-calculate the respective parameter values.

In one embodiment, one of the calculation functions can comprise multiplying or dividing at least two parameter values. This e.g. allows automatically calculating value ranges for physical variables, which starting from a base voltage value are e.g. amplified or attenuated. The user may e.g. want to measure a voltage in an electrical circuit, which is generated by a complex network of voltage amplifiers and voltage dividers. In this case, the user does not have to calculate the resulting voltage range manually but can simply model the complex network of voltage amplifiers and voltage dividers by performing the respective calculations in the parameter input. The amplifiers can e.g. be modeled by a multiplication with the respective amplification factor and the voltage dividers by a division by the respective division factor. The same applies to attenuators and the respective attenuation factor.

In one embodiment, one of the calculation functions comprises calculating the ratio of a voltage divider formed by two resistances. The user can e.g. provide the values of resistances via the respective parameter input. This allows the user to calculate e.g. voltage ranges for measuring or displaying a voltage, which is generated by a voltage divider, individually. The calculation unit can e.g. calculate the ratio of the voltage divider and multiply the input voltage value by the respective ratio to determine the voltage range for the respective measurement task.

In one embodiment, one of the calculation functions can comprise calculating the reciprocal value of a parameter value in a parameter input. This provides the user with a simple method of converting e.g. a frequency into a period or vice versa.

In one embodiment, one of the calculation functions can comprise incrementing or decrementing the value of a parameter value in a parameter input by a predetermined number. The predetermined number can e.g. be configured in a settings menu of the measurement device. In one embodiment, the predetermined number can e.g. be one.

In one embodiment, one of the calculation functions can comprise multiplying the value of a parameter value in a parameter input by 10 elevated by a predetermined exponent. The Exponent can e.g. be 3, 9, 12, -3, -9, -12 or any other number. Multiple function keys can be provided for different exponents. By specifically choosing the exponent, the scale of the respective parameter value can e.g. be adapted with the push of a single function key to the SI scales kilo (exponent 3), Mega (exponent 6), Giga (exponent 9), mili (exponent -3), mikro (exponent -6), nano (exponent -9), and pico (exponent -12). This saves the user the inputting of a plurality of trailing of prefixing zeros.

In one embodiment, the measurement device can comprise a display, wherein the function keys are arrange adjacent to the display and the display shows for every function key the respective calculation function. A display can controllably change its contents. Therefore, the displayed calculation functions can also be changed. The single function keys can therefore be individually configured to trigger different calculation functions, and the respective function can be displayed to the user.

In one embodiment, the measurement device can comprise a housing and a detachable input device, which is detachably coupled to the housing, wherein the function keys are provided on the detachable input device. The detachable input device can e.g. be coupled to the rest of the measurement device via a cable or wirelessly. This allows freely positioning the detachable input device. The input device can also carry e.g. number keys, and further function keys, like e.g. an enter key for ending an input or arrows keys for navigating the different parameter inputs.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments, which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
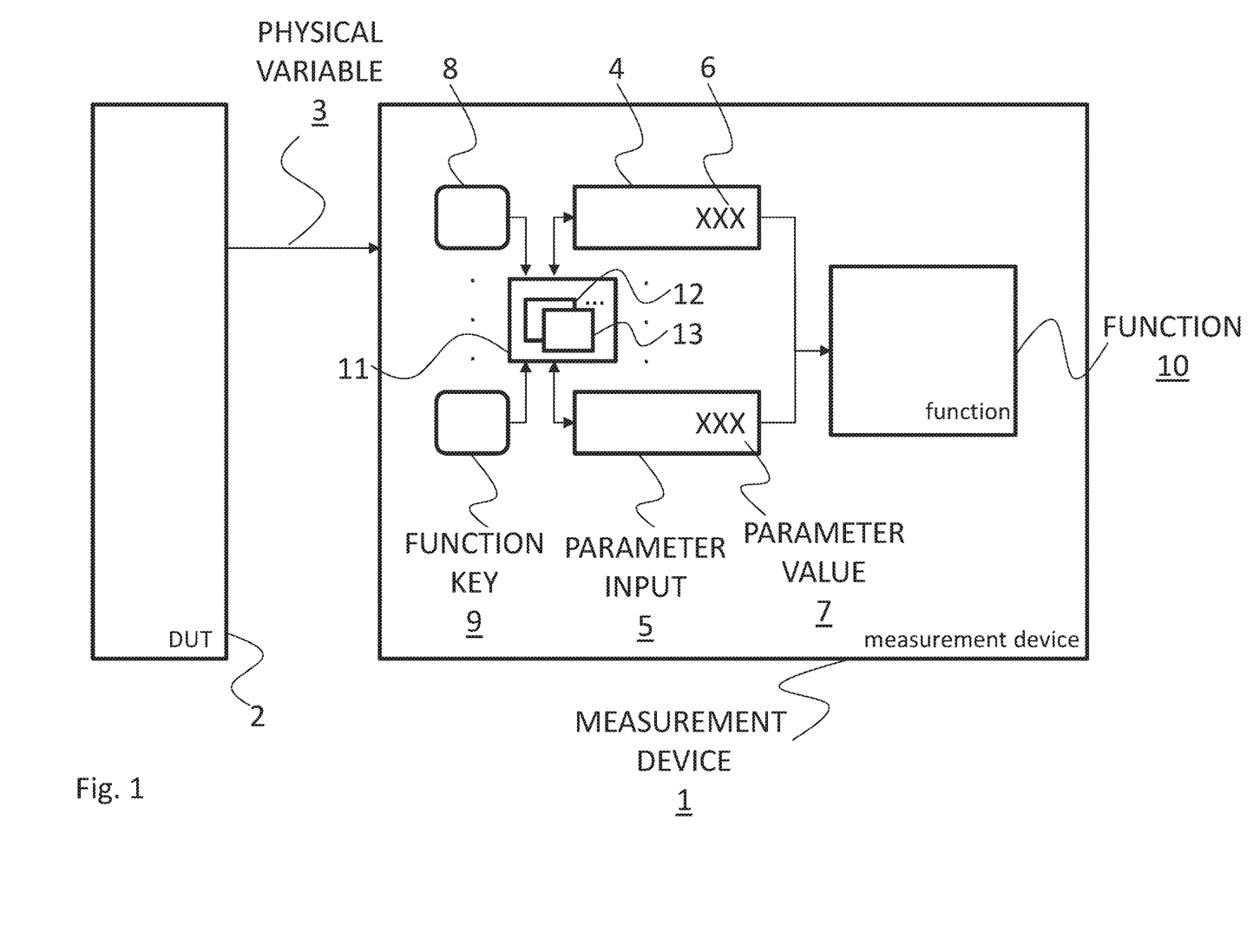
FIG. 1 shows a block diagram of an embodiment of a measurement device according to the present invention.

FIG. 1 shows a measurement device 1, which measures at least one physical variable 3 of a device under test 2. The device under test 2 can e.g. be an electric circuit and the physical variable 3 can be e.g. a voltage or a current.

The measurement circuit of the measurement device 1 is not explicitly shown. However, it is understood, that the measurement device 1 can comprise any type of adequate measurement circuits comprising elements like e.g. analog-to-digital converters, FPGAs and the like. The measurement circuit or measurement functions of the measurement device 1 are exemplarily shown as function 10. It is however clear, that the function 10 can be any configurable function in the measurement device 1. Possible other functions 10 can refer to the displaying of measured data or the like.

The measurement device 1 comprises a plurality of parameter inputs 4, 5, two of which are shown in FIG. 1. Further parameter inputs are hinted at by three dots. The parameter inputs 4, 5 serve for the user to input parameter values 6, 7 into the measurement device 1. These parameter values 6, 7 serve to configure the function 10. They can e.g. configure the time base or resolution of a measurement function 10 or the time base for displaying measured values or the like.

Further, the measurement device 1 comprises a plurality of function keys 8, 9, two of which are shown in FIG. 1. Further function keys are hinted at by three dots. Even though the function keys 8, 9 are each shown next to one of the parameter inputs 4, 5 there is now direct coupling between the function keys 8, 9 and the parameter inputs 4, 5.

Rather, the parameter inputs 4, 5 and the function keys 8, 9 are connected to a calculation unit 11, which comprises a plurality of calculation functions 12, 13, two of which are exemplarily shown.

Figure 2:
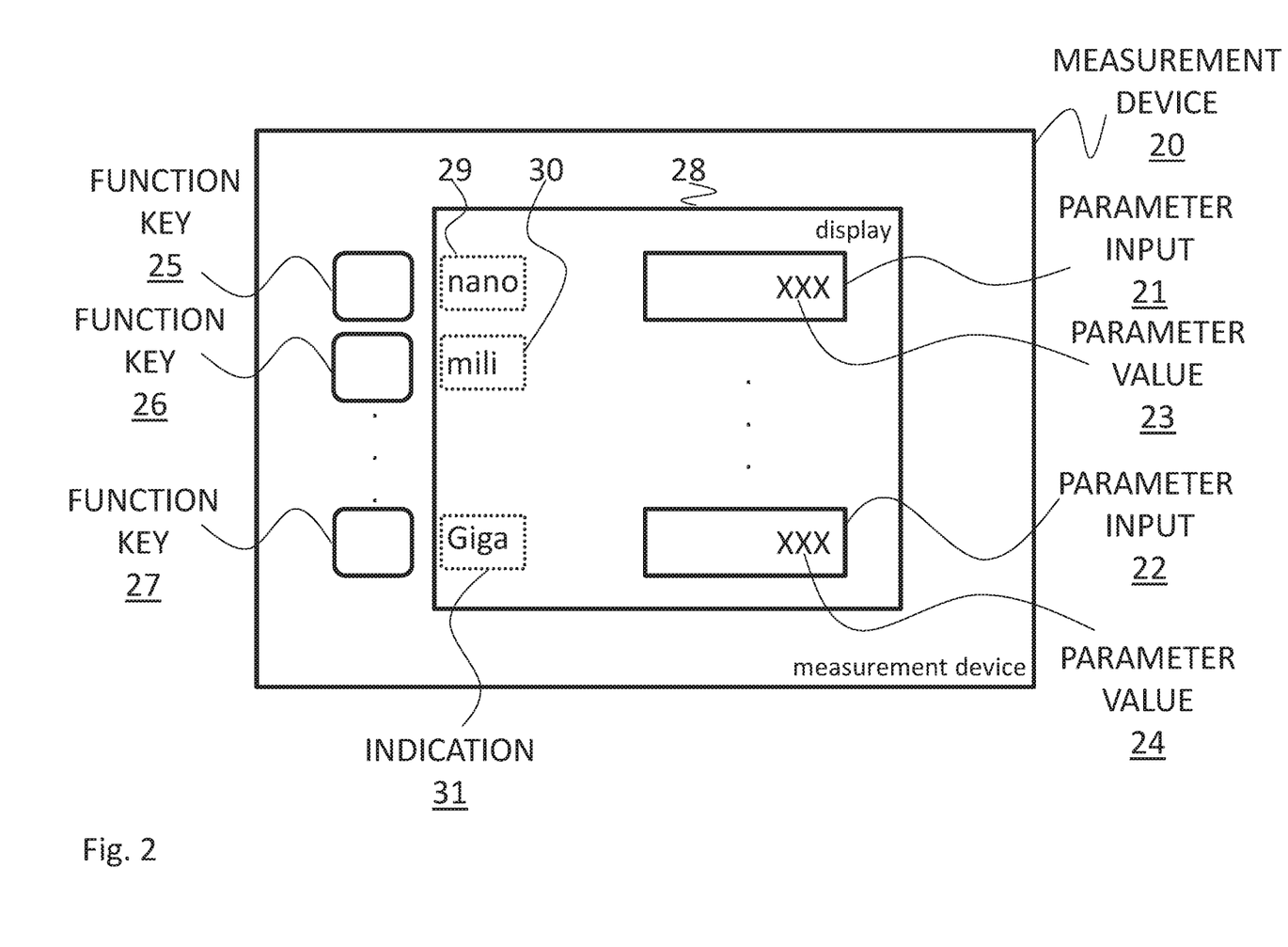
FIG. 2 shows a block diagram of another embodiment of a measurement device according to the present invention.

Every one of the function keys 8, 9 refers to one of the calculation functions 12, 13. The function keys 8, 9 can e.g. comprise an imprint of the respective function. An alternative is shown in FIG. 2, where the respective function is variably displayed on display 28.

If the user pushes one of the function keys 8, 9 this triggers the respective calculation function 12, 13 in the calculation unit 11. The calculation unit 11 will then take one or more parameter values 6, 7 of the respective parameter input 4, 5 and input the result of the respective calculation function 12, 13 into the respective parameter input 4, 5 as new parameter value 6, 7. As already explained above, this parameter value 6, 7 can then be used by the function 10 as configuration parameter. If more than one parameter value 6, 7 are required for the respective calculation function 12, 13 the respective function key 8, 9 can be pushed between entering the respective parameter values 6, 7.

Just exemplarily, the user can e.g. input "5" as parameter value 6, 7, "+" as function key 8, 9, and "3" as parameter value 6, 7. The calculation unit 11 will then perform an addition of 5 and 3 and provide 8 as the new parameter value 6, 7 in the respective parameter input 4, 5. As an alternative, the function key 8, 9 can e.g. be pushed after entering a plurality, i.e. two or more, of parameter values 6 or 7.

The respective parameter input 4, 5, which the calculation unit 11 works on can e.g. be the last active parameter input 4, 5, i.e. where the last parameter value 6, 7 has been entered. Alternatively, dedicated select buttons can be provided, to select the respective parameter input 4, 5.

Possible calculation functions 12, 13 can e.g. comprise adding, subtracting, multiplying or dividing at least two parameter values 6, 7. In addition, more complex calculation functions 12, 13 can be provided. A possible calculation function 12, 13 can e.g. calculate the ratio of a voltage divider, if two resistance values are given. Another possible calculation function 12, 13 can e.g. calculate the reciprocal value of a provided parameter value 6, 7. Another possible calculation function 12, 13 can comprise incrementing or decrementing the value of a parameter value 6, 7 by a predetermined number, e.g. 1, 2, 3 or any other number. Another possible calculation function 12, 13 can comprise multiplying the value of a parameter value 6, 7 by 10 elevated by a predetermined exponent, like e.g. 12, 9, 3, −3, −9, −12.

The measurement device 20 of FIG. 2 comprises a plurality of function keys 25, 26, 27, which are arranged left of a display 28. The parameter inputs 21, 22 with the parameter values 23, 24 are displayed on the display 28. That means that they are drawn by graphics functions on the display 28 as opposed to providing separate displays, like e.g. alphanumeric displays. In addition, on the display 28 an indication 29, 30, 31 of the respective calculation function 12, 13 a function key 25, 26, 27 refers to, is displayed next to the respective function key 25, 26, 27. It is understood, that the displaying of the indication 29, 30, 31 respective calculation function 12, 13 can also be used independently of the parameter inputs 21, 22, which are displayed on the display 28, e.g. with discrete parameter inputs.

The arrangement of FIG. 2 allows easily changing the calculation function 12, 13 a function key 25, 26, 27 refers to. The functions can e.g. be changed depending on the context of the information displayed on the display 28 or of the respective measurement function 10, which is selected by a user. The function keys 25, 26, 27 can therefore also be called "context sensitive" function keys 25, 26, 27.

Figure 3:
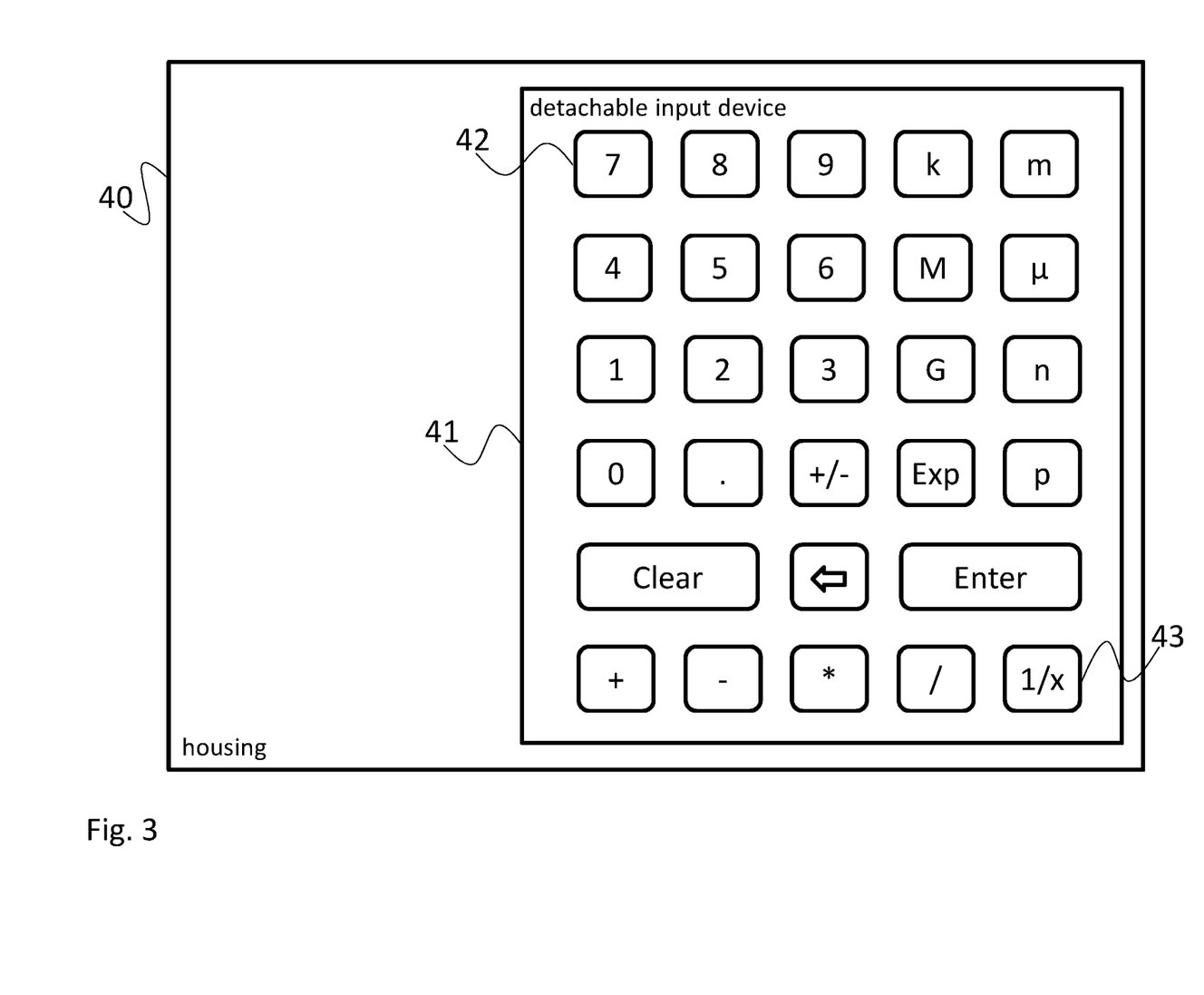
FIG. 3 shows a block diagram of an embodiment of a housing of a measurement device according to the present invention.

FIG. 3 schematically shows a possible housing 40 for a measurement device 1, 20, which carries a detachable input device 41. That means that the input device 41 can be detached from the housing 40 and e.g. be placed by a user on a table, while providing inputs via the input device 41.

The arrangement of keys and function keys 42, 43 on the detachable input device 41 is just exemplarily and can be used with any other embodiment of measurement devices 1, 20. Further, other key arrangements can be provided on the detachable input device 41. For sake of simplicity, only the first and the last keys 42, 43 are provided with a reference sign.

The detachable input device 41 comprises five columns of keys with six keys each, wherein the fifth keys of the first and second column and the fifth keys of the fourth and fifth column, respectively, form a double sized key.

Besides number keys ranging from 0 to 9, the following function keys are provided on the detachable input device 41:

p: pico→multiply the respective value by $1/1000000000000$ or $10^{-12}$ n: nano→multiply the respective value by $1/1000000000$ or $10^{-9}$ μ: mikro→multiply the respective value by $1/1000000$ or $10^{-6}$ m: mili→multiply the respective value by $1/1000$ or $10^{-3}$ k: kilo→multiply the respective value by 1000 or $10^3$ M: Mega→multiply the respective value by 1000000 or $10^6$ G: Giga→multiply the respective value by 1000000000 or $10^9$ Exp→provide an arbitrary exponent ($x^y$)

Clear→clear the respective parameter input.

Enter→finish entering a value in a parameter input

1/x→calculate the reciprocal value for the respective parameter input

+, −, *, /→perform the respective arithmetic operation

⇐ →delete last input

Figure 4:
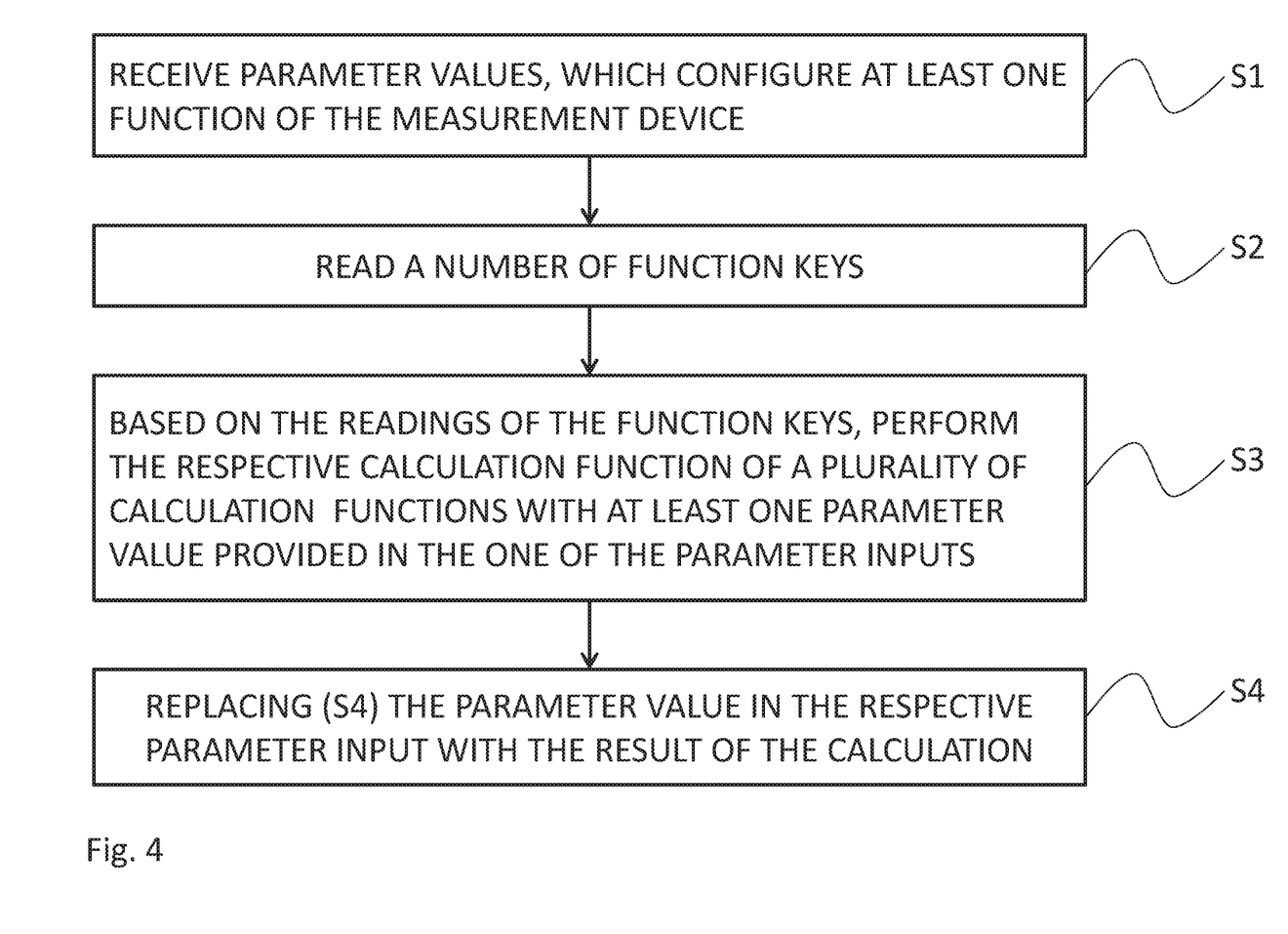
FIG. 4 shows a block diagram of an embodiment of a method according to the present invention.

FIG. 4 shows a block diagram of a configuration method for a measurement device 1, 20 for measuring a number of physical variables 3.

The method comprises receiving S1 parameter values 6, 7, 23, 24, which configure at least one function 10 of the measurement device 1, 20 via a number of parameter inputs 4, 5, 21, 22. Further a number of function keys 8, 9, 25, 26, 27, 42, 43 is read S2, wherein every function key 8, 9, 25, 26, 27, 42, 43 refers to a predetermined calculation function 12, 13.

Based on the readings of the function keys 8, 9, 25, 26, 27, 42, 43 the respective calculation function 12, 13 of a plurality of calculation functions 12, 13 is performed S3, with at least one parameter value 6, 7, 23, 24 provided in the one of the parameter inputs 4, 5, 21, 22. Further, the parameter value 6, 7, 23, 24 in the respective parameter input 4, 5, 21, 22 is replaced with the result of the calculation functions 12, 13.

Possible calculation functions 12, 13 can e.g. comprise adding, subtracting, multiplying or dividing at least two parameter values 6, 7, 23, 24. In addition, more complex calculation functions 12, 13 can be provided. A possible calculation function 12, 13 can e.g. calculate the ratio of a voltage divider, if two resistance values are given. Another possible calculation function 12, 13 can e.g. calculate the reciprocal value of a provided parameter value 6, 7, 23, 24. Another possible calculation function 12, 13 can comprise incrementing or decrementing the value of a parameter value 6, 7, 23, 24 by a predetermined number, e.g. 1, 2, 3 or any other number. Another possible calculation function 12, 13 can comprise multiplying the value of a parameter value 6, 7, 23, 24 by 10 elevated by a predetermined exponent, like e.g. 12, 9, 3, −3, −9, −12.

The method can further comprise arranging on a display 28 next to the function keys 8, 9, 25, 26, 27, 42, 43 adjacent for every function key 8, 9, 25, 26, 27, 42, 43 an indication 29, 30, 31 of the respective calculation function 12, 13.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF USED REFERENCE SIGNS 1 measurement device
2 device under test
3 physical variable
4 parameter input
5 parameter input
6 parameter value
7 parameter value
8 function key
9 function key
10 function
11 calculation unit
12 calculation function
13 calculation function
20 measurement device
21 parameter input
22 parameter input
23 parameter value
24 parameter value
25 function key
26 function key
27 function key
28 display
29 indication
30 indication
31 indication
40 housing
41 detachable input device
42 function key
43 function key

The invention claimed is:

1. A measurement device comprising:
at least one measurement input, wherein the measurement input is configured to measure at least one physical variable from a device under test (DUT),
a number of parameter inputs,
wherein the parameter inputs comprise physical inputs configured to receive parameter values input by a user, and a display configured to display the received parameter values,
wherein the parameter values comprise digital numbers and configure at least one operational function of the measurement device operating on the at least one physical variable measured from the DUT, and
wherein the at least one operational function comprises a measurement function, a calculation unit comprising circuitry to:
perform calculation functions with at least one parameter value provided in the display of the respective parameter input, and
replace the parameter value in the display of the respective parameter input with the result of the calculation,
a controller for configuring the measurement device, wherein the displayed result of the calculation is used as a parameter for configuring the at least one measurement input, and
a number of function keys,
wherein every function key controls the calculation unit to perform a predetermined one of the calculation functions, and wherein the functions of the function keys are changed depending on a selected measurement function.

2. The measurement device according to claim 1, wherein one of the calculation functions comprises adding or subtracting at least two parameter values.

3. The measurement device according to claim 1, wherein one of the calculation functions comprises multiplying or dividing at least two parameter values.

4. The measurement device according to claim 1, wherein one of the calculation functions comprises calculating the ratio of a voltage divider formed by two resistances based on the measured at least one physical variable.

5. The measurement device according to claim 1, wherein one of the calculation functions comprises calculating the reciprocal value of a parameter value in a parameter input.

6. The measurement device according to claim 1, wherein one of the calculation functions comprises incrementing the value of a parameter value in a parameter input by a predetermined number.

7. The measurement device according to claim 1, wherein one of the calculation functions comprises decrementing the value of a parameter value in a parameter input by a predetermined number.

8. The measurement device according to claim 1, wherein one of the calculation functions comprises multiplying the value of a parameter value in a parameter input by 10 elevated by a predetermined exponent.

9. The measurement device according to claim 1, wherein the function keys are arranged adjacent to the display and the display shows for every function key an indication of the respective calculation function.

10. The measurement device according to claim 1, comprising a housing and a detachable input device, which is detachably coupled to the housing, and
wherein the function keys are provided on the detachable input device.

11. The measurement device of claim 1, wherein the measurement device comprises an oscilloscope configured to measure a plurality of physical variables, wherein physical variables comprise voltages and currents in an electrical circuit.

12. A configuration method for a measurement device for measuring a number of physical variables, the method comprising:
measuring at least one physical variable, of the number of physical variables, from a device under test (DUT);
receiving parameter values input by a user,
wherein the parameter values comprise digital numbers and configure at least one operational function of the measurement device operating on the at least one physical variable measured from the DUT, via physical inputs of a number of parameter inputs,
wherein the received parameter values are displayed on a display of the parameter input, and
wherein the at least one operational function comprises a measurement function, reading a number of function keys,
wherein every function key refers to a predetermined calculation function, and
wherein the functions of the function keys are changed depending on a selected measurement function,
based on the readings of the function keys performing the respective calculation function of a plurality of calculation functions with at least one parameter value displayed in the display of a respective one of the parameter inputs,
replacing the parameter value in the display of the respective parameter input with the result of the calculation, and
configuring a measurement input of the measurement device based on the result of the calculation displayed in the display of a respective one of the parameter inputs displaying the result of the calculation.

13. The configuration method according to claim 12, wherein one of the calculation functions comprises adding or subtracting at least two parameter values.

14. The configuration method according to claim 12, wherein one of the calculation functions comprises multiplying or dividing at least two parameter values.

15. The configuration method according to claim 12, wherein one of the calculation functions comprises calculating the ratio of a voltage divider formed by two resistances based on the measured at least one physical variable.

16. The configuration method according to claim 12, wherein one of the calculation functions comprises calculating the reciprocal value of a parameter value in a parameter input.

17. The configuration method according to claim 12, wherein one of the calculation functions comprises incrementing the value of a parameter value in a parameter input by a predetermined number.

18. The configuration method according to claim 12, wherein one of the calculation functions comprises decrementing the value of a parameter value in a parameter input by a predetermined number.

19. The configuration method according to claim 12, wherein one of the calculation functions comprises multiplying the value of a parameter value in a parameter input by 10 elevated by a predetermined exponent.

20. The configuration method according to claim 12, arranging on the display next to the function keys adjacent for every function key an indication of the respective calculation function.

* * * * *